United States Patent
Van Deursen

(10) Patent No.: US 6,564,446 B2
(45) Date of Patent: May 20, 2003

(54) COMPONENT PLACEMENT MACHINE

(75) Inventor: Johannes Albertus Maria Van Deursen, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 35 days.

(21) Appl. No.: 10/022,170

(22) Filed: Oct. 30, 2001

(65) Prior Publication Data

US 2002/0085901 A1 Jul. 4, 2002

(30) Foreign Application Priority Data

Nov. 2, 2000 (EP) .......................................... 00203824

(51) Int. Cl.[7] .............................................. B23P 19/00
(52) U.S. Cl. ...................................... 29/739; 198/345.3
(58) Field of Search ........................... 29/739, 740, 729; 198/345.3

(56) References Cited

U.S. PATENT DOCUMENTS

| | | | | |
|---|---|---|---|---|
| 4,797,996 A | * | 1/1989 | Lobry et al. ................... | 29/740 |
| 4,898,268 A | * | 2/1990 | Kamioka et al. ........ | 198/345.1 |
| 4,947,980 A | * | 8/1990 | Helmstetter .............. | 198/345.3 |
| 5,086,559 A | * | 2/1992 | Akatsuchi .................... | 29/834 |
| 5,680,699 A | | 10/1997 | Vos .............................. | 29/833 |
| 5,985,029 A | * | 11/1999 | Purcell ........................ | 118/324 |
| 6,190,997 B1 | * | 2/2001 | Becker et al. .............. | 438/401 |
| 6,282,777 B1 | * | 9/2001 | Van De Rijdt ................ | 29/740 |
| 6,324,752 B1 | * | 12/2001 | Wesseling et al. ............ | 29/740 |
| 6,374,729 B1 | * | 4/2002 | Doyle ......................... | 101/114 |

* cited by examiner

Primary Examiner—Christopher P. Ellis
Assistant Examiner—Richard Ridley
(74) Attorney, Agent, or Firm—Aaron Waxler

(57) ABSTRACT

Component placement machine with a frame (1) and a transport device (2) for transporting printed circuit boards (3) in an X-direction, which transport device (2) comprises at least one transport beam (7, 8) which is movable in the X-direction in a reciprocating manner, and which transport device (2) is provided with first clamping means (9) which are fixedly connected to the transport beam (7, 8) in the X-direction for clamping-in of at least one side of the printed circuit boards lying in the X-direction, while the machine is further provided with second clamping means (13) which are connected to the frame (1) and which may clamp at least one side of the printed circuit boards, such that the first and second clamping means (9, 13) are brought alternately into their active clamping positions, the first clamping means being active during the movement of the circuit boards in the positive X-direction and the second clamping means being active during the return movement of the transport device in the negative X-direction.

7 Claims, 3 Drawing Sheets

COMPONENT PLACEMENT MACHINE

Figure 1:
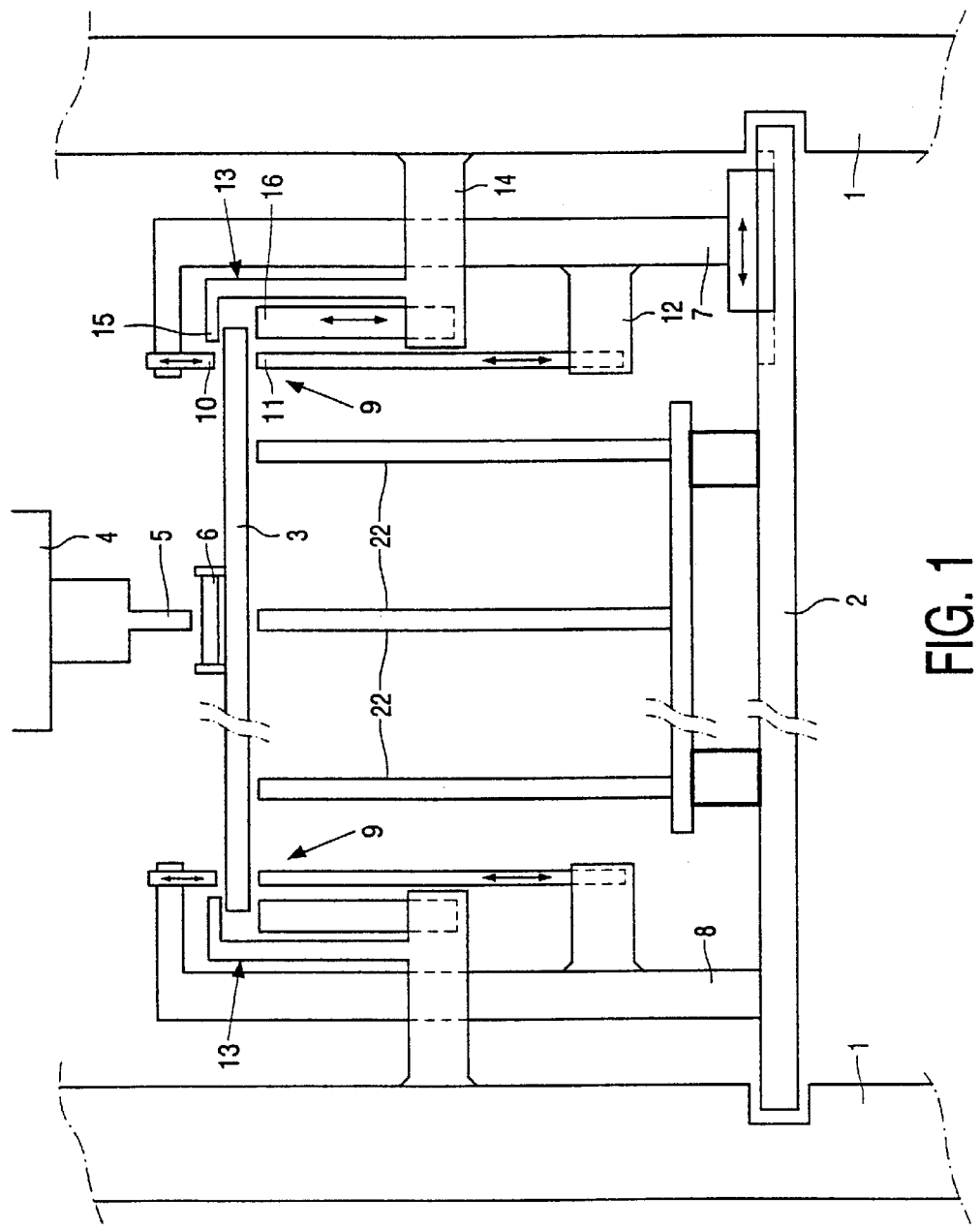

The invention relates to a component placement machine with a frame and with a transport device for transporting printed circuit boards in an X-direction, which transport device comprises a transport beam extending in the X-direction, which beam can be driven in the X-direction in a reciprocating movement.

A component placement machine of the kind to which the present invention relates is known from U.S. Pat. No. 5,680,699. The transport beam in this known machine is provided with transport pins and positioning pins for the printed circuit boards. Said pins enter matching openings of the printed circuit boards. The transport beam transports the printed circuit boards in an indexing mode in the positive X-direction, i.e. the transport beam with the printed circuit boards perform an intermittent movement over a predetermined distance each time, which distance corresponds to a certain position of the printed circuit boards with respect to a component placement head. Such a movement is necessary for bringing the printed circuit boards into a desired position under the placement head so that the components can be placed in the correct positions by means of the placement head. After a number of intermittent step movements, the transport beam is at the end of its stroke and is to be returned to its starting position again. At that moment the pins are withdrawn from the holes in the printed circuit boards in that the entire transport beam is moved down, i.e. in a Z-direction perpendicular to the X-direction, whereupon the transport beam is returned to its starting position in the negative X-direction. A fresh printed circuit board may then be placed on the transport beam, and the last printed circuit board may be removed from the row on the transport beam. In view of the high accuracy with which components are to be placed and of the fact that the size of the components and the interspacings between the components on the printed circuit boards become increasingly smaller, it is necessary for said transport movements to be carried out with very high accuracy. A disadvantage of this known manner of transport is that the tool set for the positioning and transport pins present on the machine must be replaced with a different tool set whenever a different type of printed circuit board is to be provided with components. In addition, a new calibration must be carried out. All this takes much time.

It is an object of the invention to avoid the disadvantage mentioned above.

To achieve this object, the component placement machine according to the invention is characterized in that the transport device is provided with first clamping means fixedly connected to the transport beam in the X-direction for clamping in at least one lateral edge extending in the X-direction of the printed circuit boards to be transported, and in that the device is further provided with second clamping means connected to the frame for clamping at least one lateral edge extending in the X-direction of the printed circuit boards, which first and second clamping means can be brought into their active clamping positions alternately such that the first clamping means are active during the movement of the transport beam in the positive X-direction and the second clamping means are active during returning of the transport beam in the negative X-direction.

In the placement machine according to the invention, the printed circuit boards present on the transport beam are fixed by the first clamping means during the movement of the transport beam in the positive X-direction, said clamping means being active in this phase of the movement. After a number of indexing steps have been performed by the transport beam, and the latter has reached the end of its stroke, the printed circuit boards are clamped in by the second clamping means, which are activated at that moment, whereas the first clamping means are brought into their idle position. In this situation, the printed circuit boards are now fixed relative to the frame, and the transport beam can return to its starting position without taking along the printed circuit boards. The positions of the printed circuit boards in each phase of the transport through the placement machine are accurately defined in this manner without the use of transport or positioning pins. Converting of the machine to other types of printed circuit boards may now take place in a simple and quick manner, while a fresh calibration is not necessary.

One or several printed circuit boards may be present on the transport beam along the length of the placement machine. Said printed circuit boards may lie substantially against one another and may have a thickness tolerance difference with respect to one another. To guarantee that all printed circuit boards will be clamped in with a satisfactory clamping force by the clamping means, a further embodiment of the placement machine is characterized in that the first and second clamping means are formed by a number of separate clamping devices which extend in longitudinal direction one behind the other. The use of clamping devices with dimensions smaller than the dimension of each of the printed circuit boards will achieve that each of the printed circuit boards will always be clamped in by at least two clamping devices.

The placement machine according to the invention may be constructed such that the first and second clamping means extend on either side of the transport beam. This means that the printed circuit boards are gripped on both sides in a component-free zone of approximately 3 mm during operation. In an alternative embodiment of the machine according to the invention, the first clamping means are present at one side of the transport beam, and the second clamping means are present at the other side of the transport beam. This means that a component-free zone of approximately 3 mm is necessary again, but on both sides of the printed circuit boards this time, the first clamping means gripping the printed circuit board in the one zone during transport in the positive X-direction, and the second clamping means gripping the printed circuit board in the other component-free zone during the return movement of the transport beam to its starting position.

In a further embodiment of the machine according to the invention, it is equally possible that the first and the second clamping means are provided at one side of the transport beam, while the machine is provided with a guide for the other lateral edge of the printed circuit board at the other side. In this embodiment, the printed circuit board is gripped by the first clamping means during transport in the positive X-direction, while in the next phase, during the return movement of the transport beam, the printed circuit board is gripped in this component-free zone by the second clamping means.

To have a possibility of compensating for non-parallelism in the machine and sagging differences between printed circuit boards in a further embodiment of the placement machine, the first clamping means are constructed such that they clamp in the printed circuit board with a greater clamping force at the one side of the transport beam and clamp in the printed circuit board with a smaller clamping force at the other side, such that the printed circuit boards in the latter location have a displacement possibility transverse to the X-direction. The position of the printed circuit board is thus defined by the clamping means which clamp in the printed circuit boards at the one side with a great clamping force, whereas the printed circuit board has the possibility of slightly shifting in or together with the clamping means at the other side, so that non-parallelism or sagging of the printed circuit board will not lead to fractures or jamming of the printed circuit boards in the machine.

A further embodiment of the placement machine according to the invention is characterized in that the first clamping means have a jaw which is adjustable in a vertical direction transverse to the X-direction with respect to the transport beam so as to press against the upper side of the printed circuit board.

The invention will now be explained in more detail below with reference to the drawing, in which three embodiments of component placement machines are shown by way of example.

Figure 2:
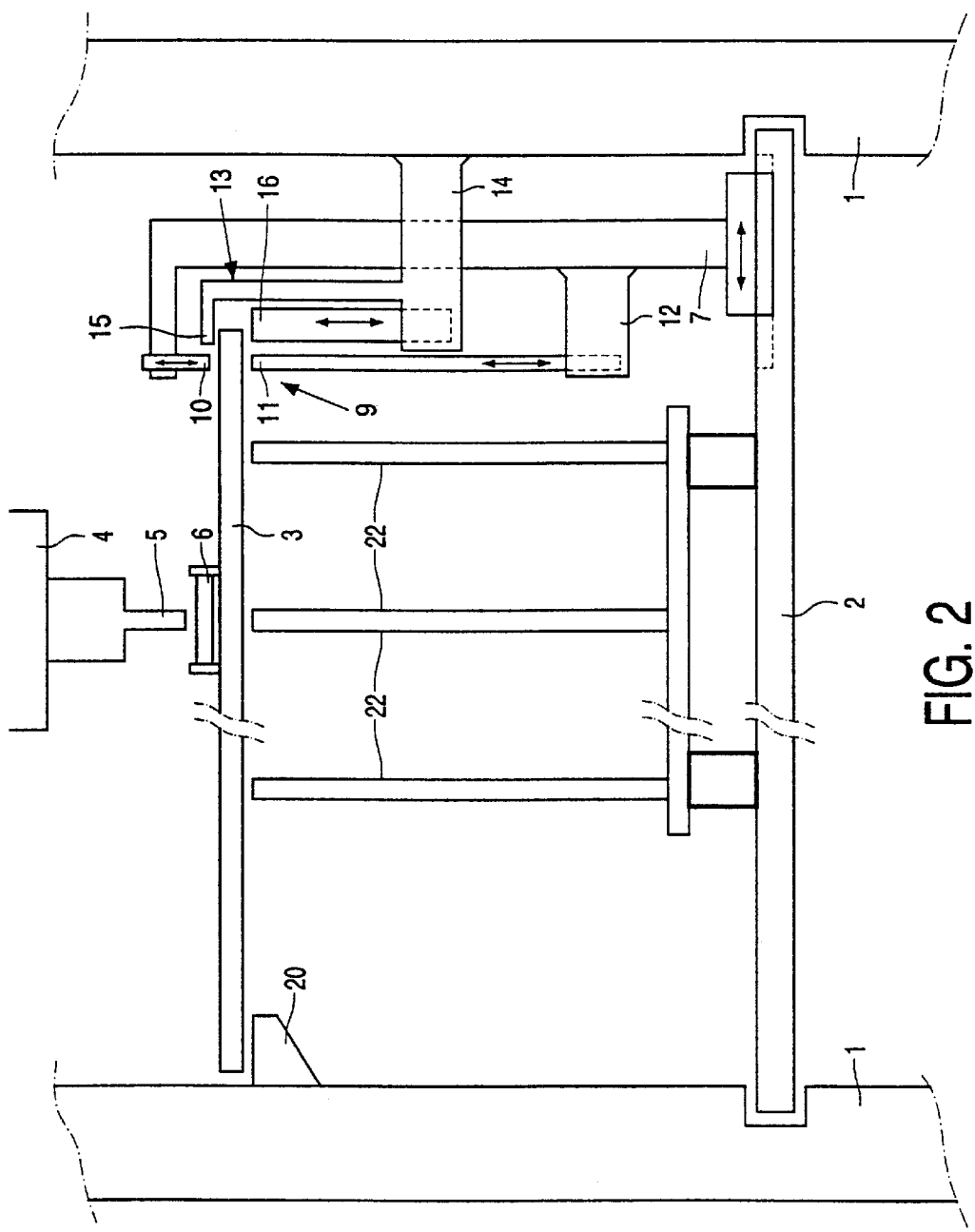
Figure 3:
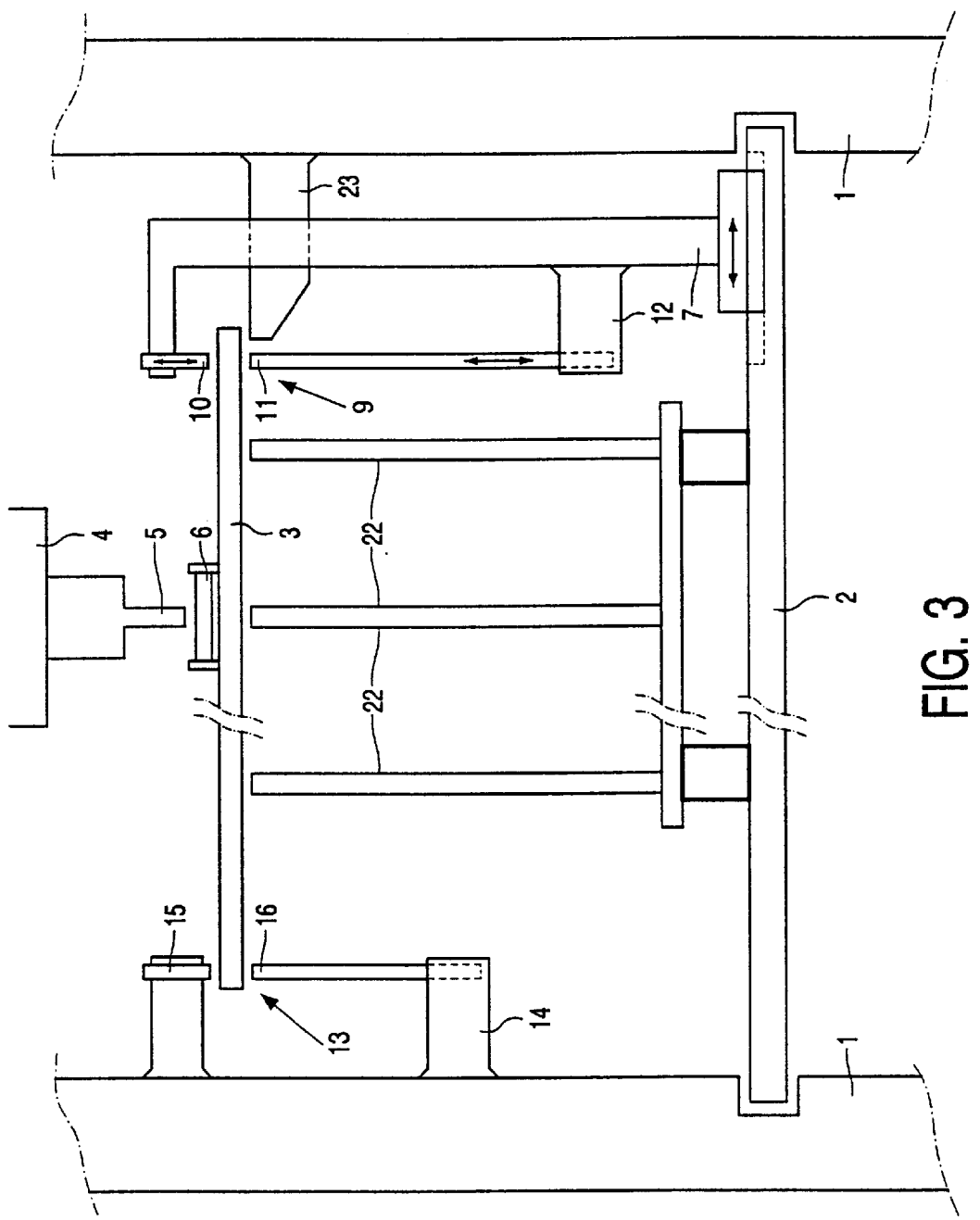

FIGS. 1, 2, and 3 diagrammatically show three embodiments of a component placement machine in cross-sectional view, not true to scale.

The component placement machine of FIG. 1 is provided with a frame 1 in which a transport device 2 is accommodated, which device can be indexed over a certain distance in the positive X-direction by means which are not shown, whereupon the transport device 2 can be moved back into its starting position in the negative X-direction after said distance has been covered. Printed circuit boards 3 can be transported through the machine by the transport device 2. Components 6 may be taken from a feeder by a placement head 4, which is provided with a vacuum tube 5 or some other pick-up member, and subsequently be placed on a printed circuit board 3. The components 6 in this case have very small dimensions, and the distance between placed components is also very small, which implies that the placement of the components on the printed circuit boards should take place with the highest possible accuracy. To achieve this, it is necessary for the printed circuit boards 3 to occupy a very accurately defined position during their transport through the component placement machine. The component placement machine of FIG. 1 is for this purpose provided with two transport beams 7 and 8 which are placed on the transport device 2. Each of the transport beams 7 and 8 is provided with a clamping device 9 connected thereto and formed by a jaw 10, the latter component forming part of the transport beam 7 or 8, as applicable, and cooperating with the upper surface of the printed circuit board 3, and a jaw 11 which is fixedly connected to the respective transport beam 7, 8 via a part 12. The jaws 10 and 11 can be moved up and down towards the printed circuit board by suitable means, for example pneumatic, electric, or mechanical means. During the movement of the transport device 2, the clamping devices 9 are active, so that the printed circuit board 3 is secured at both its lateral edges in a component-free lateral zone of at most 3 mm. This means that the printed circuit board is moved along with the transport device in steps through the machine, during which its position is fixed because the printed circuit board is clamped in between the two clamping devices. After the transport device 2 has moved over a certain distance in steps in the positive X-direction, the forward movement is ended, and the transport device is to be returned to its starting position in the negative X-direction. For this purpose, first the clamping means 13 fixedly connected to the frame 1 at both sides via a part 14 are activated, whereupon the clamping devices 9 are deactivated. Said clamping means 13 are formed by a fixed jaw portion 15, which cooperates with the upper side of the printed circuit board, and a movable jaw portion 16 which is movable up and down at the lower side in the part 14, again by pneumatic, electric, or mechanical means. After the clamping means 13 have been activated and the printed circuit board has become clamped in between the jaw portions 15 and 16, the transport device 2 with the beams 7 and 8 can be moved back into its starting position, during which the printed circuit boards 3 do not move along, but are retained accurately positioned with respect to the frame 1. After the return movement has been completed, a new printed circuit board on which components are to be placed can be laid on the transport beams 7 and 8 at the entrance of the placement machine, after which the clamping devices 9 become active again, so that the printed circuit boards are clamped in again between the jaw portions 10 and 11, and the clamping devices 13 are deactivated, so that the printed circuit board is released from the latter. Then the transport of the transport device through the placement machine can take place again in the same manner.

Since the printed circuit boards 3 may show thickness differences owing to tolerances, the jaws 10 are movably accommodated in the beams 7 and 8, such that their height adapts itself to the upper side of the printed circuit boards 3. The nominal thickness differences of the printed circuit boards are compensated for by the jaws at the lower side. The jaw portions 11 and 15 of the clamping devices 9 and 13 may extend over the entire length of the placement machine as one integral whole, but in view of the fact that thickness differences may occur in the printed circuit boards, it is advantageous to construct the jaw portions 10 and 16 as a number of parts one lying behind the other, the length of each part being smaller than the longitudinal dimension of the printed circuit boards in each case. It is achieved thereby that each of the printed circuit boards will be satisfactorily clamped in by at least one jaw part in spite of the thickness differences among printed circuit boards.

To make the machine suitable for printed circuit boards of different lateral dimensions, the transport beam 7 is placed on the transport device 2 so as to be displaceable in lateral direction on the machine. To prevent problems arising from deviations from parallelism between the transport beams 7 and 8, the clamping force of the clamping means 9 and 13 is chosen to be greater at the side of the transport beam 7 than at the side of the transport beam 8. This has the result that the clamping means 11 and 13 at the right-hand side define the position of the printed circuit board, while the printed circuit board is capable of a slight displacement at the left-hand side, at the area of the beam 8, in the clamping means present there if parallelism problems should occur. This displacement may be achieved in that the printed circuit boards are clamped in with a smaller clamping force there, or in that the jaws themselves are mounted with a slight displacement possibility. If so desired, the functions of 7 and 8 may be interchanged.

The printed circuit boards 3 are additionally supported by a bed of pins, represented by the support pins 22 in the drawing, in a usual manner.

Clamping means are provided in the machine of FIG. 1 both on the right-hand side and on the left-hand side of the machine and of the printed circuit board, but in the embodiment of FIG. 2 the printed circuit board 3 is clamped in at the right-hand side only in the same manner as in FIG. 1, while the left-hand side merely comprises a guide 20 which is fixedly connected to the frame 1 and along which the printed circuit board can be guided with its left-hand side without being clamped in. The machine is simplified in this manner without sacrificing the accuracy.

It is also possible, as FIG. 3 shows, to provide the clamping means 9 at the right-hand side only, at the area of the transport beam 7, and to provide the clamping means 13 at the left-hand side. In this case the printed circuit board 3 will be clamped in only between the jaw portions 10 and 11 of the clamping means 9 during transport in the positive X-direction, and will accordingly move along with the transport device 2 through the machine, during which its left-hand side slides between the clamping parts 16 and 15 of the clamping device 13, whereas during the return transport of the transport device 2 in the negative X-direction the printed circuit boards 3 are gripped between the clamping parts 15 and 16 of the clamping device 13 connected to the frame 1 on the left-hand side of the device. The other side of the printed circuit board may then be supported by a fixed ridge 23. A simplification of the placement machine is obtained again in this manner as compared with the embodiment of FIG. 1.

It will be clear from the preceding description that a good positioning of the printed circuit boards is safeguarded in each phase of their movement owing to the alternate gripping of the printed circuit boards in the transport direction during the forward transport and in the frame during the return transport of the transport beams to their starting position.

What is claimed is:

1. A component placement machine with a frame (1) and with a transport device (2) for transporting printed circuit boards (3) in an X-direction, which transport device comprises at least one transport beam (7, 8) extending in the X-direction, which beam can be driven in the X-direction in a reciprocating movement, characterized in that the transport device (2) is provided with first clamping means (9) fixedly connected to the transport beam (7, 8) in the X-direction for clamping in at least one lateral edge extending in the X-direction of the printed circuit boards (3) to be transported, and in that the device is further provided with second clamping means (13) connected to the frame (1) for clamping at least one lateral edge extending in the X-direction of the printed circuit boards, which first and second clamping means (9, 13) can be brought into their active clamping positions alternately such that the first clamping means are active during the movement of the transport beam in the positive X-direction and the second clamping means are active during returning of the transport beam in the negative X-direction.

2. A component placement machine as claimed in claim 1, characterized in that the first and second clamping means (9, 13) are formed by a number of separate clamping devices which extend in longitudinal direction one behind the other.

3. A component placement machine as claimed in claim 1, characterized in that the first and second clamping means extend on either side of the transport device (2, 7, 8).

4. A component placement machine as claimed in claim 1, characterized in that the first clamping means (9) are present at one side of the transport device (2, 7), and the second clamping means (13) are present at the other side of the transport device.

5. A component placement machine as claimed in claim 1, characterized in that the first and the second clamping means are provided at one side of the transport dvice (2, 7), and the machine is provided with a guide (20) for the other lateral edge of the printed circuit board at the other side.

6. A component placement machine as claimed in claim 3, characterized in that the first clamping means (9) clamp in the printed circuit boards with a great clamping force at one side of the transport device, whereas they clamp in the printed circuit boards at the other side such that the printed circuit boards have a displacement possibility in the clamping means.

7. A component placement machine as claimed in claim 1, characterized in that the first clamping means (9) have a jaw (10) which is adjustable in a vertical direction transverse to the X-direction with respect to the transport device so as to press against the upper side of the printed circuit board.

\* \* \* \* \*